US011392192B2

(12) United States Patent
Uejima

(10) Patent No.: US 11,392,192 B2
(45) Date of Patent: Jul. 19, 2022

(54) SEMICONDUCTOR DEVICE FROM TRANSFERRING PROGRAMS FROM A ROM TO AN SRAM

(71) Applicant: RENESAS ELECTRONICS CORPORATION, Tokyo (JP)

(72) Inventor: Kazuya Uejima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 510 days.

(21) Appl. No.: 16/575,108

(22) Filed: Sep. 18, 2019

(65) Prior Publication Data

US 2020/0133381 A1      Apr. 30, 2020

(30) Foreign Application Priority Data

Oct. 24, 2018  (JP) .............................. JP2018-199680

(51) Int. Cl.
*G06F 1/3287*      (2019.01)
*G11C 16/30*       (2006.01)
(Continued)

(52) U.S. Cl.
CPC ........... *G06F 1/3287* (2013.01); *G04B 19/04* (2013.01); *G04G 3/00* (2013.01); *G06F 1/04* (2013.01);
(Continued)

(58) Field of Classification Search
CPC ........ G06F 1/3287; G06F 1/04; G06F 1/3275; G04B 19/04; G04G 3/00; G11C 11/417;
(Continued)

(56) References Cited

U.S. PATENT DOCUMENTS

| 9,646,679 B2 | 5/2017 | Kamohara et al. |
| 2016/0180923 A1* | 6/2016 | Kamohara ............ H01L 27/092 |
| | | 365/156 |

(Continued)

FOREIGN PATENT DOCUMENTS

| JP | 2004-013337 A | 1/2004 |
| JP | 2004-070854 A | 3/2004 |
| JP | 2016-115891 A | 6/2016 |

OTHER PUBLICATIONS

Japanese Notice of Reasons for Refusal issued in corresponding Japanese Patent Application No. 2018-199680, dated Jan. 25, 2022, with English translation.

*Primary Examiner* — Jerome Leboeuf
(74) *Attorney, Agent, or Firm* — McDermott Will & Emery LLP

(57) ABSTRACT

A semiconductor device capable of reducing electric power consumption while suppressing deterioration in reliability is provided. The semiconductor device includes a flash memory, a SRAM formed on a SOI substrate, oscillation circuits generating a signal of a first frequency and a signal of a second frequency lower than the first frequency, and a processor operating in synchronization with a system clock. The processor performs steps of turning on a power supply of the flash memory, lowering a threshold voltage of the SRAM, transferring a program from the flash memory to the SRAM by using the signal of the first frequency as the system clock, turning off the power supply of the flash memory, heightening the threshold voltage of the SRAM, and executing the program stored in the SRAM by using the signal of the second frequency as the system clock.

19 Claims, 10 Drawing Sheets

(51) Int. Cl.
  *G11C 11/417* (2006.01)
  *G11C 16/32* (2006.01)
  *G11C 11/419* (2006.01)
  *G04G 3/00* (2006.01)
  *G11C 14/00* (2006.01)
  *H01L 27/11* (2006.01)
  *G06F 1/04* (2006.01)
  *G04B 19/04* (2006.01)
  *H01L 27/12* (2006.01)

(52) U.S. Cl.
  CPC .......... *G11C 11/417* (2013.01); *G11C 11/419* (2013.01); *G11C 14/0063* (2013.01); *G11C 16/30* (2013.01); *G11C 16/32* (2013.01); *H01L 27/1104* (2013.01); *H01L 27/1203* (2013.01)

(58) Field of Classification Search
  CPC ... G11C 11/419; G11C 14/0063; G11C 16/30; G11C 16/32; G11C 5/147; G11C 11/005; H01L 27/1104; H01L 27/1203; H01L 27/1116; H01L 27/11286; H01L 27/105; Y02D 10/00
  See application file for complete search history.

(56) References Cited

U.S. PATENT DOCUMENTS

2017/0062041 A1\* 3/2017 Kataoka .............. G11C 11/4096
2019/0079575 A1\* 3/2019 Hanson ................ G06F 1/3237

\* cited by examiner

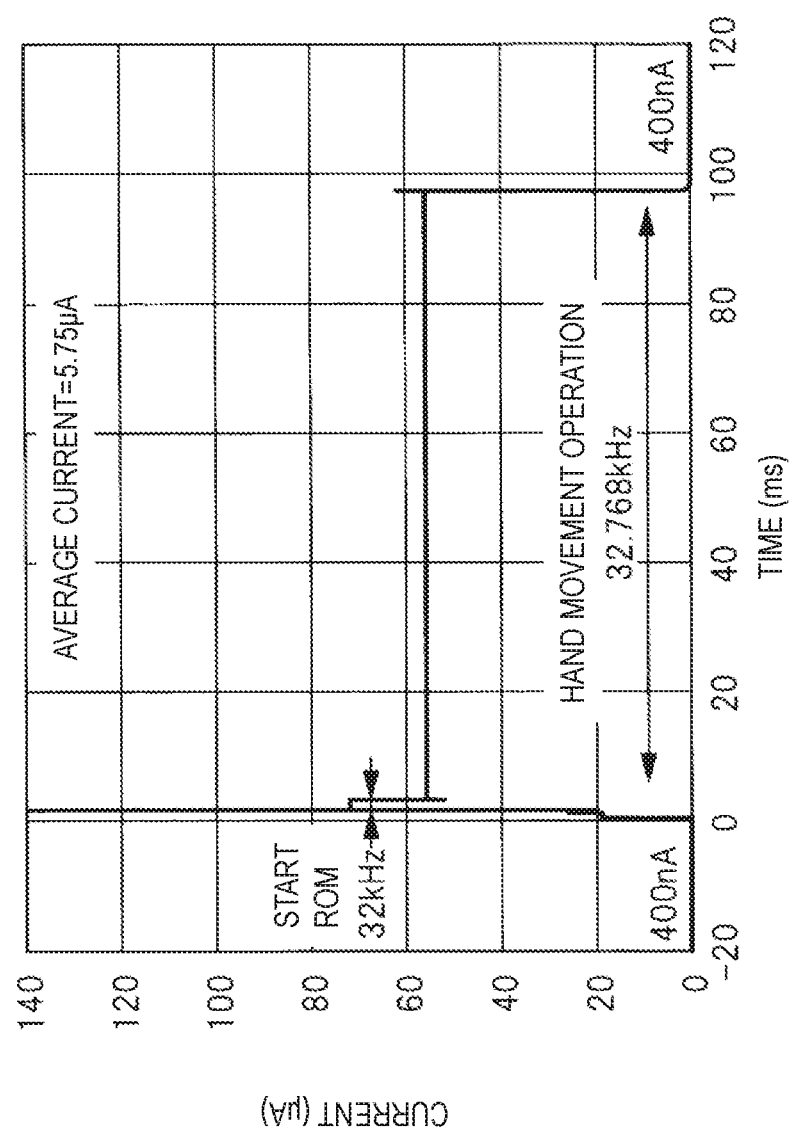

SEMICONDUCTOR DEVICE FROM TRANSFERRING PROGRAMS FROM A ROM TO AN SRAM

CROSS-REFERENCE TO RELATED APPLICATIONS

The disclosure of Japanese Patent Application No. 2018-199680 filed on Oct. 24, 2018 including the specification, drawings and abstract is incorporated herein by reference in its entirety.

BACKGROUND

The present invention relates to a semiconductor device. For example, the present invention relates to a semiconductor device having a volatile memory, a nonvolatile memory and a central processor device (hereinafter called a "processor"). For example, in Japanese unexamined Patent Application publication No. 2004-070854 (Patent Document 1), there is disclosed a semiconductor device that includes a rewritable nonvolatile memory and a RAM which is volatile memory and that reduces an electric power consumption. In FIG. 1 of Patent Document 1, there is disclosed a data processor having a processor, a RAM and a rewritable nonvolatile memory. Patent Document 1 discloses that a program is transferred from the nonvolatile memory to the RAM during the power-on reset. Patent Document 1 discloses that the processor executes the program transferred to the RAM in a state in which the operation of the nonvolatile memory is stopped after the reset is released, for transferring to a low power mode. Patent Document 1 discloses that an electric power consumption by the nonvolatile memory is reduced as a function inherent of the data processor without depending on the program because the transfer of the program is performed during the power-on reset. Thereby, a low electric power consumption of the data processor as a whole is realized.

SUMMARY

In a semiconductor device including a nonvolatile memory (hereinafter called a "ROM") and a processor, it is considered that a program is stored in the ROM in advance, and the processor reads and executes the program stored in the ROM.

When a rewritable nonvolatile memory such as a flash memory is used as the ROM and the program is executed at a low speed operation such as 32 kHz, for example, a DC (Direct Current) leakage current flowing through the flash memory may hinder a reduction of an electric power consumption. Therefore, the customer request might not be satisfied, for example.

As described in Patent Document 1, if the program is transferred to the RAM, the operation of the flash memory is stopped, the program is read from the RAM, and the program is executed, the DC leakage current flowing through the flash memory can be reduced. Therefore, the electric power consumption can be reduced.

However, there is a fear that the program stored in the RAM may be changed due to, for example, a soft error, a noise and the like. More specifically, the soft error, the noise and the like may cause a bit value in the RAM to be inverted. Therefore, there is a fear that the program is changed by garbled bits.

That is, according to Patent Document 1, although it is possible to reduce the electric power consumption, there is a problem that reliability is sacrificed. As shown in FIG. 6 of Patent Document 1, in the second and subsequent low electric power consumption modes, the program stored in the RAM is executed again at the time of a first power-on reset. Therefore, Patent Document 1 does not recognize a problem related to reliability.

Other matters to be solved and novel features of the present invention will become apparent from the description of the present specification and the appended drawings.

According to one embodiment of the present invention, there is provided a semiconductor device comprising a ROM storing a first program, a static memory (hereinafter called a "SRAM") formed on a thin film BOX-SOI (Silicon On Insulator) substrate, a substrate bias circuit for controlling a substrate bias voltage of the SRAM, a first oscillation circuit for generating a signal of a first frequency, a second oscillation circuit for generating a signal of a second frequency lower than the first frequency, and a processor operating in synchronization with a system clock signal.

The processor performs a first step of turning on a power of the ROM and lowering a threshold voltage of the SRAM by using the substrate bias circuit, a second step of setting the signal of the first frequency as the system clock signal and transferring the first program from the ROM to the SRAM, and a third step of turning off the power of the ROM and setting the signal of the second frequency as the system clock signal and heightening the threshold voltage of the SRAM by using the substrate bias circuit and executing the first program transferred to the SRAM.

According to one embodiment of the present invention, the first to third steps are repeatedly performed a plurality of times.

According to one embodiment of the present invention, it is possible to provide the semiconductor device capable of reducing the electric power consumption while suppressing a reliability degradation.

BRIEF DESCRIPTION OF THE DRAWINGS

FIGS. 7A and 7B are diagrams showing average currents of the semiconductor devices according to the first embodiment and a first comparison example;

DETAILED DESCRIPTION

Figure 1:
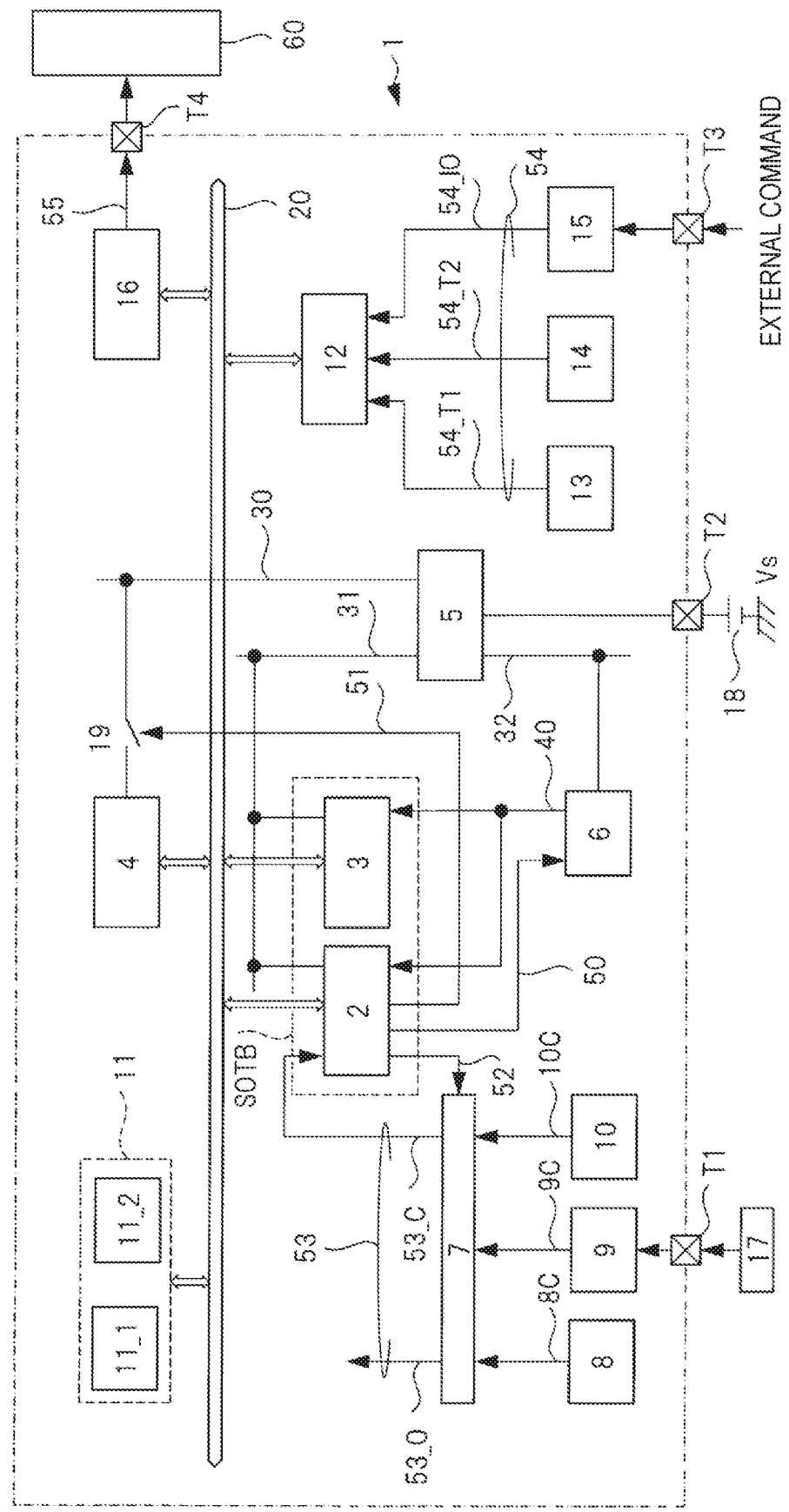
FIG. 1 is a block diagram showing a configuration of a semiconductor device according to a first embodiment.

Hereinafter, each embodiment of the present invention will be described with reference to the drawings. It should be noted that the disclosure is merely one example and appropriate modifications that can be easily conceived of by those skilled in the art, while the gist of the invention is kept, naturally fall within the scope of the invention. Further, in the drawings, the width, thickness, shape, and the like of each part may be more schematically illustrated than the actual form for clearer description, but it is merely one example and the interpretation of the invention should not be limited.

Furthermore, in this specification and each drawing, the same reference numerals are given to the same elements as those previously described with reference to the preceding drawings, and detailed description may be omitted appropriately.

First Embodiment (Configuration of Semiconductor Device)

FIG. 1 is a block diagram showing a configuration of a semiconductor device according to a first embodiment. Although not particularly limited, a semiconductor device 1 shown in FIG. 1 is a microcontroller for a wristwatch. The semiconductor device 1 is comprised of one semiconductor chip. In FIG. 1, a plurality of circuit blocks and the like drawn in a region surrounded by a dashed line are formed in one semiconductor chip. Of course, the semiconductor device 1 may be configured by combining a plurality of semiconductor chips. For example, the semiconductor device 1 may be constituted by two semiconductor chips, such as a first semiconductor chip and a second semiconductor chip. In this instance, the first semiconductor chip may include a processor and a SRAM, which will be described later, and the second semiconductor chip may include a flash memory, which will be described later. Further, the semiconductor device 1 may be constituted by three semiconductor chips, namely, a semiconductor chip for the processor, a semiconductor chip for the SRAM, and a semiconductor chip for the flash memory.

The semiconductor device 1 has a plurality of terminals, and four terminals T1 to T4 are illustrated in FIG. 1. An external crystal oscillation circuit 17 is coupled to the terminal T1, and a battery cell 18 for operating the semiconductor device 1 is coupled to the terminal T2. An external command is supplied to the terminal T3 from a button (not shown) and the like. A hand moving motor 60 for moving a hand of the wristwatch is coupled to the terminal T4. The hand moving motor 60 is operated, for example, every second by a drive signal 55 output from the terminal T4. A hand movement operation is performed so that a hand display of the wristwatch is advanced for 1 second. In FIG. 1, Vs represents a ground voltage. Although not shown, the semiconductor device 1 also includes a terminal to which the ground voltage Vs is supplied.

The semiconductor device 1 comprises various circuit blocks, but only the circuit blocks required for illustration are depicted in FIG. 1. In FIG. 1, reference numeral 2 denotes a processor, reference numeral 3 denotes a SRAM which is a volatile memory, and reference numeral 4 denotes a flash memory which is a rewritable ROM. Reference numeral 11 denotes a register group, Reference numeral 12 denotes an interrupt controller, and 16 denotes a motor driver. The processor 2, the SRAM 3, the flash memory 4, the register group 11, the interrupt controller 12, and the motor driver 16 are coupled to each other by a bus 20.

The processor 2 accesses the SRAM 3, the flash memory 4, the register group 11, the interrupt controller 12, and the motor driver 16 via the bus 20. A plurality of programs are stored in advance in the flash memory 4. The processor 2 reads out the programs stored in the flash memory 4 and performs operations in accordance with the read-out programs. As will be described later in detail, the processor 2 reads a first program from the flash memory 4, transfers the first program to the SRAM 3, and reads the first program transferred to the SRAM 3 from the SRAM 3 to execute the first program. The motor driver 16 is controlled by executing the first program, and the motor driver 16 outputs the drive signal 55 to operate the hand moving motor 60.

In FIG. 1, reference numeral 5 denotes a voltage regulator, and reference numeral 6 denotes a substrate bias circuit. A power supply voltage is supplied from the battery cell 18 to the voltage regulator 5 via the terminal T2. The voltage regulator 5 generates a plurality of operating voltages from the supplied power supply voltage and supplies the operating voltages to various circuit blocks via voltage wirings. Three voltage wirings 30 to 32 are illustrated in FIG. 1. A voltage wiring 30 is a voltage wiring for supplying an operating voltage for operating the flash memory 4, and a voltage wiring 31 is a voltage wiring for supplying an operating voltage for operating the processor 2 and the SRAM 3. A voltage wiring 32 is a voltage wiring for supplying an operating voltage for operating the substrate bias circuit 6.

Although not particularly limited, in the first embodiment, the processor 2 and the SRAM 3 are formed on an SOI substrate (on a thin film BOX-SOI substrate) having a thin film BOX formed by a SOTB (Silicon On Thin-Box) technique. A region of the thin film BOX formed by the SOTB technique is a region SOTB surrounded by a broken line in FIG. 1. The substrate bias circuit 6 supplies a substrate bias voltage 40 based on the operating voltage supplied via the voltage wiring 32 to a substrate region of the thin film BOX to control threshold voltages of MOS transistors formed in the substrate region. That is, the threshold voltages of a plurality of MOS transistors constituting the processor 2 are controlled by the substrate bias circuit 6, and the threshold voltages of a plurality of MOS transistors constituting the SRAM are also controlled by the substrate bias circuit 6. Hereinafter, for ease of explanation, the threshold voltages of the plurality of MOS transistors constituting the processor 2 is also referred to as a threshold voltage of the processor 2. Similarly, the threshold voltages of the plurality of MOS transistors constituting the SRAM 3 is also referred to as the threshold voltage of the SRAM 3.

The substrate bias circuit 6 outputs the substrate bias voltage 40 in accordance with a substrate bias control signal 50 provided from the processor 2. Therefore, the threshold voltages of the processor 2 and SRAM 3 will vary in accordance with the substrate bias control signal 50 provided from the processor 2.

A power switch 19 is coupled between the voltage wiring 30 and the flash memory 4. The power switch 19 is controlled by a ROM power control signal 51 from the processor 2. When the power switch 19 is turned on by the ROM power control signal 51, the operating voltage is supplied to the flash memory 4 via the voltage wiring 30 and the power switch 19. When the operating voltage is supplied, a circuit constituting the flash memory 4, for example, a booster circuit which generates a high voltage for writing, an oscillation circuit and the like, starts to operate. On the other hand, when the power switch 19 is turned off by the ROM power control signal 51, the operation voltage is not supplied to the flash memory 4, and the booster circuit and the oscillation circuit does not start operation. Since the operating voltage is not supplied, it is possible to prevent a DC leakage current from being generated in the flash memory 4. Since the booster circuit, the oscillation circuit and the like do not operate, it is possible to reduce an electric power consumption in the flash memory 4.

Although not particularly limited, the semiconductor device 1 according to the first embodiment includes three oscillation circuits 8 to 10. In the three oscillation circuits 8 to 10, the first oscillation circuit 8 generates an oscillation signal (first oscillation signal) 8C of 2 MHz, the second oscillation circuit 9 generates an oscillation signal (second oscillation signal) 9C of 32.768 kHz, and the third oscillation circuit 10 generates an oscillation signal (third oscillation signal) 10C of 32 kHz. The second oscillation circuit 9 is coupled to the external crystal oscillation circuit 17 via a terminal T1. A high-precision oscillation signal generated by the external crystal oscillation circuit 17 is supplied to the second oscillation circuit 9, and the second oscillation circuit 9 generates a high-precision oscillation signal 9C for a timepiece.

The third oscillation circuit 10 is a low-speed oscillation circuit for system used during standby and the like. The third oscillation circuit 10 is manufactured so that a frequency of the oscillation signal 10C to be generated is about 32 kHz, but the frequency of the oscillation signal 10C varies by about several percent due to variations at the time of manufacturing or the like. The first oscillation circuit 8 is a high-speed oscillation circuit for system used during high-speed operation or the like. The first oscillation circuit 8 is also manufactured so that a frequency of the oscillation signal 8C to be generated is about 2 MHz, but the frequency of the oscillation signal 8C varies due to variations at the time of manufacturing or the like. As illustrated, the frequency of the first oscillation signal 8C is higher than the frequencies of the second oscillation signal 9C and the third oscillation signal 10C, and the frequency of the second oscillation signal 9C is higher than the frequency of the third oscillation signal 10C. However, the frequency of the second oscillation signal 9C and the frequency of the third oscillation signal 10C may be the same, or the frequency of the third oscillation signal 10C may be higher than the frequency of the second oscillation signal 9C.

The first oscillation signal 8C, the second oscillation signal 9C, and the third oscillation signal 10C are supplied to a selector 7. The selector 7 selects an oscillation signal from the supplied first to third oscillation signals 8C to 10C in accordance with a system clock selection signal 52 provided from the processor 2, and outputs the selected oscillation signal as the system clock signals 53. The system clock signals 53 are supplied to various circuit blocks, and a system clock signal 53_C supplied to the processor 2 and a system clock signal 53_O supplied to other circuit block are illustrated in FIG. 1.

The processor 2 operates in synchronization with the supplied system clock signal 53_C. The processor 2 executes the program to generate the substrate bias control signal 50, the ROM power control signal 51, and the system clock selection signal 52. Therefore, by executing the program, the threshold voltages of the processor 2 and the SRAM 3 can be changed, the on/off state of the flash memory 4 can be controlled, and an operation rate of the processor 2 can be changed.

In FIG. 1, reference numeral 13 denotes a first timer, reference numeral 14 denotes a second timer, and reference numeral 15 denotes an input/output port. The register group 11 includes a first register 11_1 and a second register 11_2 corresponding to the first timer 13 and the second timer 14. A time information measured by the first timer 13 is set in the first register 11_1, and a time information measured by the second timer 14 is set in the second register 11_2. The first timer 13 and the second timer 14 generate an interrupt request signal 54_T1 and an interrupt request signal 54_T2 when the measured times exceed the times set in the first register 11_1 and the second register 11_2, respectively. When the external command is supplied to the input/output port 15 via the terminal T3, the input/output port 15 generates an interrupt request signal 54_IO.

When the interrupt request signals 54_T1, 54_T2 and 54_IO are supplied to the interrupt controller 12, the interrupt controller 12 serves a notice to the processor 2. The processor 2 executes the program corresponding to the notified interrupt request signal.

For example, the time information corresponding to 1 second is set in the first register 11_1. As a result, the first timer 13 generates the interrupt request signal 54_T1 every time 1 second is measured. When the interrupt request signal 54_T1 is supplied to the interrupt controller 12, the interrupt controller 12 notifies the processor 2 of the generation of the interrupt request signal 54_T1, and the processor 2 executes the program corresponding to the interrupt request signal 54_T1. By executing the program, the processor 2 controls the motor driver 16 so that the motor driver 16 outputs the drive signal 55.

Functions of the second timer 14, the second register 11_2, and the input/output port 15 will be described later.

Here, an exemplary embodiment is described that includes the hand moving motor 60 and the motor driver 16 for driving the motor. However, the timepiece display may be a liquid crystal. In this instance, a liquid crystal driver is used instead of the motor driver 16, and an external liquid crystal device is used instead of the hand moving motor 60.

(Structure of Semiconductor Device)

Figure 2:
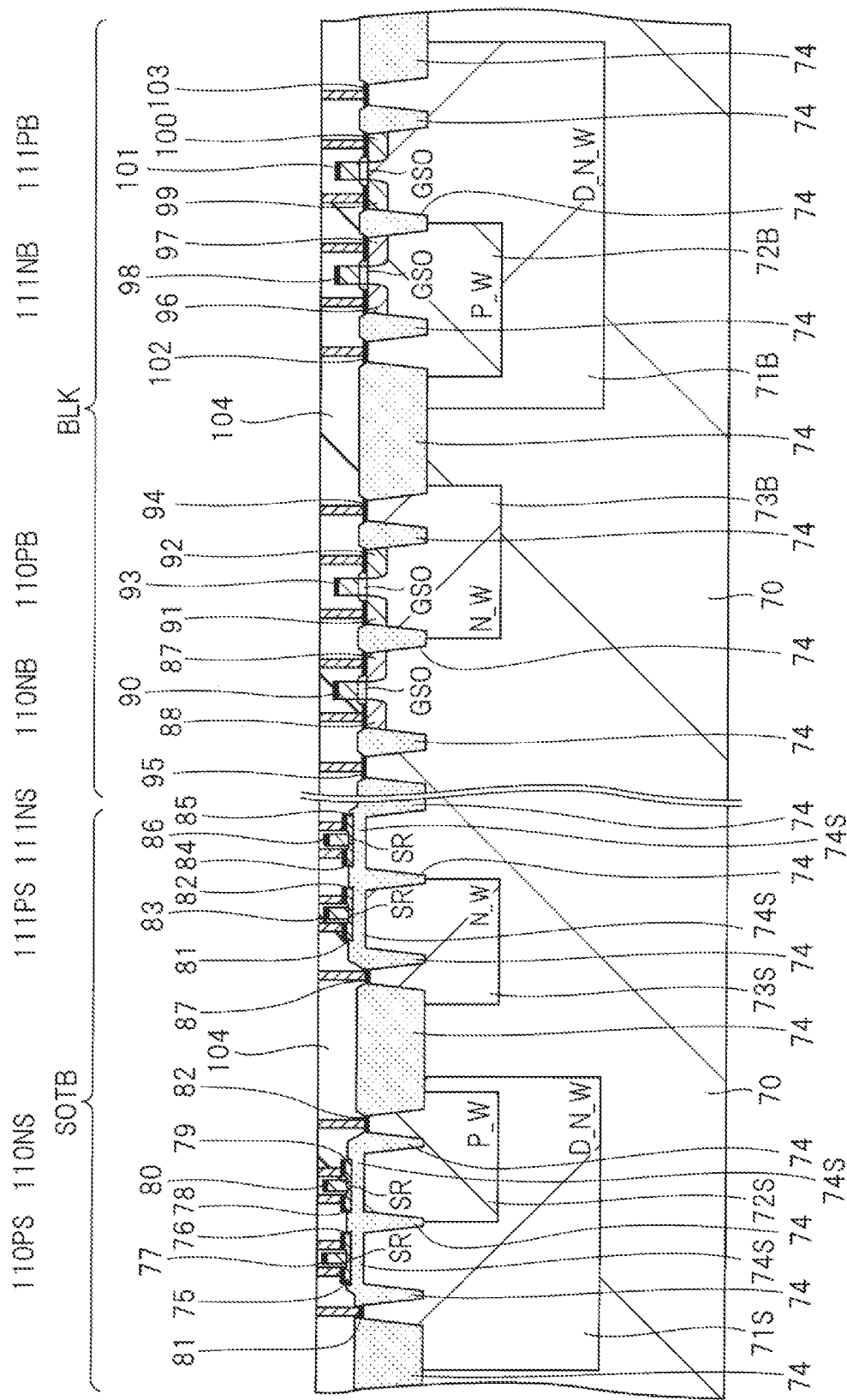
FIG. 2 is a schematic cross-sectional diagram showing a structure of the semiconductor device according to the first embodiment.

FIG. 2 is a schematic cross-sectional diagram showing a structure of the semiconductor device according to the first embodiment. In FIG. 2, a cross-sectional diagram of the semiconductor chip comprising the semiconductor device 1 is shown. In FIG. 2, a portion indicated by SOTB indicates a region of the thin film BOX formed by the SOTB technique, and a portion indicated by BLK indicates a bulk region.

A plurality of P-channel MOS transistors (hereinafter called a "PMOS transistors") and a plurality of N-channel MOS transistors (hereinafter called a "NMOS transistors") are formed in the regions of the thin film BOX region SOTB and the bulk region BLK, respectively, and two PMOS transistors and two NMOS transistors formed in the respective regions are illustrated in FIG. 2. That is, PMOS transistors 110PS and 111PS and NMOS transistors 110NS and 111NS formed in the thin film BOX region SOTB are exemplified in FIG. 2. Further, PMOS transistors 110PB and 111PB and NMOS transistors 110NB and 111NB formed in the bulk region BLK are exemplified in FIG. 2.

The PMOS transistor 110PS and the NMOS transistor 110NS are MOS transistors constituting the processor 2 or the SRAM 3 formed in the thin film BOX region SOTB and shown in FIG. 1. For example, the PMOS transistor 110PS and the NMOS transistor 110NS comprise an inverter circuit. The inverter circuit constitutes a memory cell constituting the SRAM 3. Alternatively, the PMOS transistor 110PS and the NMOS transistor 110NS constitute a low-voltage logic circuit constituting the processor 2.

On the other hand, the PMOS transistor 111PS and the NMOS transistor 111NS are used to form a level-shifting circuit formed in the thin film BOX region SOTB. The substrate bias voltage 40 is supplied from the substrate bias circuit 6 to substrate regions of the PMOS transistor 110PS and the NMOS transistor 110NS as will be described later. On the other hand, the substrate bias voltage 40 is not supplied from the substrate bias circuit 6 to substrate regions of the PMOS transistor 111PS and the NMOS transistor 111NS formed in the same thin film BOX region SOTB. This allows the threshold voltages of the processor 2 and the SRAM 3 to be changed by the substrate bias circuit 6, but a threshold voltage of the level-shifting circuit is not changed by the substrate bias circuit 6 and is constant. For example, the level-shifting circuit is used to transmit signals between the processor 2 or the SRAM 3 formed in the thin film BOX region SOTB and a circuit block formed in the bulk region BLK.

The PMOS transistor 110PB and the NMOS transistor 110NB formed in the bulk region BLK are used to form an ESD-protecting element or a level-shifting circuit. The PMOS transistor 111PB and the NMOS transistor 111NB formed in the bulk region BLK are used to form, for example, an analogue circuit. As shown in FIG. 1, the substrate bias voltage 40 provided from the substrate bias circuit 6 is fed to the thin film BOX region SOTB in the semiconductor chip and is not fed to the bulk region BLK. That is, the substrate bias voltage 40 provided from the substrate bias circuit 6 are not supplied to the substrate regions of the PMOS transistors 110PB and 111PB and the NMOS transistors 110NB and 111NB formed in the bulk region BLK.

Next, structures of the PMOS transistor and the NMOS transistor in the semiconductor chip will be described. Although not particularly limited, a P-type semiconductor substrate 70 is used as a substrate in the first embodiment.

In FIG. 2, reference characters 71S and 71B show deep N-type well regions formed in the semiconductor substrate 70, and reference characters 72S and 72B show P-type well regions formed in the N-type well regions 71S and 71B. In addition, reference characters 73S and 73B are shallower than the above-mentioned N-type well regions 71S and 71B and indicate N-type well regions formed in the semiconductor substrate 70.

The PMOS transistor 110PS includes a P-type source region 75, a P-type drain region 76, and a gate electrode 77. The P-type source region 75 and the P-type drain region 76 are formed on a main surface of the N-type well region 71S via a thin insulating film 74S, and a thin silicon film SR is formed between the P-type source region 75 and the P-type drain region 77 in plan view. The gate electrode 77 is formed on the thin silicon film SR formed between the P-type source region 75 and the P-type drain region 76 via a gate insulating film (not shown). When a predetermined voltage is supplied to the gate electrode 77 with respect to the P-type source region, a channel is formed in the thin silicon film SR. The substrate region of the PMOS transistor 110PS is comprised of the N-type well region 71S. The N-type well region 71S is coupled to an electrode 81, and the substrate bias voltage 40 provided from the substrate bias circuit 6 are supplied to the electrode 81.

The NMOS transistor 110NS includes a N-type source region 78, a N-type drain region 79, and a gate electrode 80. The N-type source region 78 and the N-type drain region 79 are formed on a main surface of the P-type well region 72S via the thin insulating film 74S, and a thin silicon film SR is formed between the N-type source region 78 and the N-type drain region 79 in plan view. The gate electrode 80 is formed on the thin silicon film SR formed between the N-type source region 78 and the N-type drain region 79 via a gate insulating film (not shown). When a predetermined voltage is supplied to the gate electrode 80 with respect to the N-type source region, a channel is formed in the thin silicon film SR. The substrate region of the NMOS transistor 110NS is comprised of the P-type well region 72S. The P-type well region 72S is coupled to an electrode 82, and the substrate bias voltage 40 provided from the substrate bias circuit 6 is supplied to the electrode 82.

For ease of explanation, in FIG. 1, the substrate bias voltages supplied to the N-type well region 71S and the P-type well region 72S are denoted by a common reference numeral 40, but the substrate bias voltage supplied to the N-type well region 71S and the substrate bias voltage supplied to the P-type well region 72S are different in polarity, for example.

Like the PMOS transistor 110PS, the PMOS transistor 111 PS includes a P-type source region 81, a P-type drain region 82, and a gate electrode 83. The P-type source region 81 and the P-type drain region 82 are formed on a main surface of the N-type well region 73S via the thin insulating film 74, and the gate electrode 83 is formed on a thin silicon film SR formed between the P-type source region 81 and the P-type drain region 82 via a gate insulating film (not shown). Since the substrate bias voltage 40 is not supplied to the PMOS transistor 111PS, a fixed predetermined voltage is supplied to an electrode 87 coupled to the N-type well region 73S serving as a substrate region of the PMOS transistor 111PS.

Like the NMOS transistor 110NS, the NMOS transistor 111NS includes an N-type source region 84, an N-type drain region 85, and gate electrodes 86. The N-type source region 84 and the N-type drain region 85 are formed on a main surface of the substrate 70 via the thin insulating film 74, and the gate electrode 86 is formed on a thin silicon film SR formed between the N-type source region 84 and the N-type drain region 85 via a gate insulating film (not shown). The substrate region of the NMOS transistor 111 PS is formed by the substrate 70. The substrate 70 is coupled to an electrode 95 to be described later, and a fixed predetermined voltage is supplied to the electrode 95.

The N-type MOS transistor 110NB includes an N-type source region 88 and an N-type drain region 89 formed in the substrate 70, and a gate electrode 90 formed in the substrate 70 via a gate insulating film GSO. The P-type MOS transistor 110PB includes a P-type source region 91 and a P-type drain region 92 formed in the N-type well region 73B, and a gate electrode 93 formed in the N-type well region 73 B via a gate insulating film GSO.

The fixed predetermined voltage is supplied to the electrode 95, a voltage of the substrate 70 becomes the fixed predetermined voltage, and voltages of the substrate regions of the N-type MOS transistors 111NS and 110NB become the fixed predetermined voltages. In addition, a fixed predetermined voltage is supplied to the electrode 94, and a voltage of the N-type well region 73B, which is the substrate region of the P-type MOS transistor 110PB, also becomes the fixed voltage.

The N-type MOS transistor 111NB includes an N-type source region 96 and an N-type drain region 97 formed in the P-type well region 72B, and a gate electrode 98 formed in the P-type well region 72B via a gate insulating film GSO. The P-type MOS transistor 111PB includes a P-type source region 99 and a P-type drain region 100 formed in the N-type well region 71B, and a gate electrode 101 formed in the N-type well region 71B via a gate insulating film GSO.

The N-type well region 71B is coupled to an electrode 103, and the P-type well region 72B is coupled to an electrode 102. Fixed predetermined voltages are supplied to the electrodes 102 and 103, and the voltages of the substrate regions (P-type well region 72B and N-type well region 71B) of the N-type MOS transistors 111NB and 111PB become the fixed predetermined voltages.

In FIG. 2, reference numeral 74 denotes an insulating layer for electrically isolating each MOS transistor and the semiconductor region for voltage supply, and reference numeral 104 denotes an insulating layer for covering each MOS transistor and the like. A portion extending upward from each electrode indicates a wiring for connecting the electrode and the wiring layer.

According to the first embodiment, the processor 2 and the SRAM 3 are d comprised of the MOS transistors 110 PS and 110NS which are separated from the semiconductor substrate 70 and the like by the insulating film 74S and in which the channels are formed in the silicon films SR. By making the silicon film SR sufficiently thin, a field effect of the MOS transistor is enhanced, and the MOS transistor can be operated without adding an impurity which causes variation in the threshold voltage. Therefore, the variation of the threshold voltage is eliminated, and the operating voltage of the processor 2 and the SRAM 3 can be lowered. In addition, the threshold voltages of the MOS transistors 110PS and 110NS can be changed by controlling the substrate bias voltage 40. For example, a leakage current of the MOS transistor can be reduced by heightening the threshold voltage of the MOS transistor. As a result, the electric power consumption can be reduced.

(Operation of Semiconductor Device)

Figure 3:
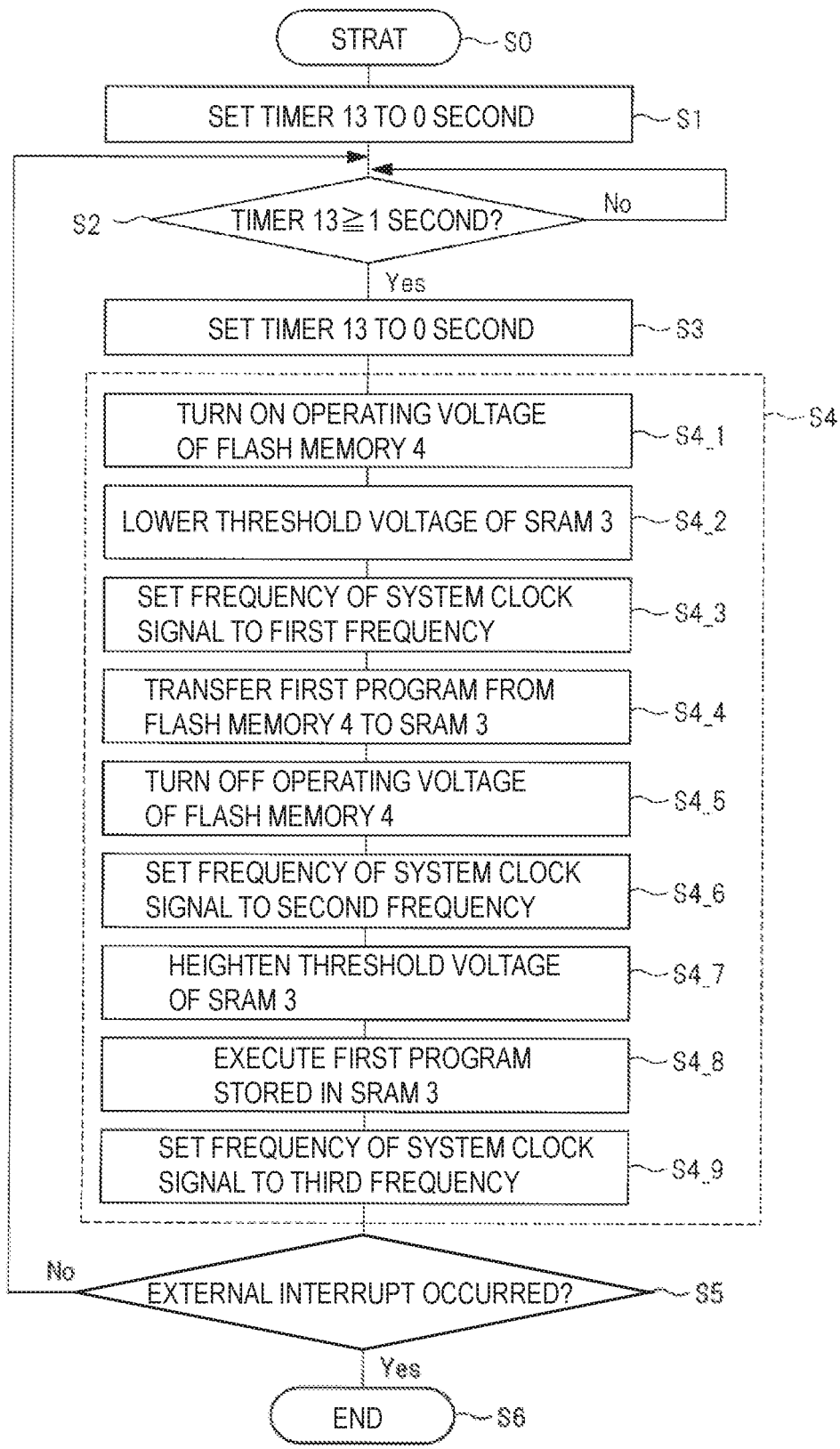
FIG. 3 is a flow chart showing an operation of the semiconductor device according to the first embodiment.

Next, an operation of the semiconductor device 1 shown in FIG. 1 will be described. FIG. 3 is a flow chart showing an operation of the semiconductor device according to the first embodiment. Here, it is assumed that a hand moving program (hereinafter called a "first program") for causing the processor 2 to perform the hand movement operation for driving a second hand is stored in advance in the flash memory 4.

In a step S0, the operation is started. In a step S1, the processor 2 sets the first timer 13 to 0 second and operates the first timer 13. Here, it is assumed that a time information indicating 1 second is stored in advance in the register 11_1. The first timer 13 starts to operate, starts to measure time, and generates the interrupt request signal 54_T1 when the measured time exceeds a time (1 second) represented by the time information stored in the register 11_1. A step S2 shows the operation of the first timer 13, measures time from the start of the operation until reaching 1 second, and generates the interrupt request signal 54_T1 when it exceeds 1 second.

When the interrupt request signal 54_T1 is detected by the interrupt controller 12, an interrupt is notified to the processor 2. The processor 2 executes a program corresponding to the notified interrupt. By the execution of this program, the following steps S3 to S5 are performed.

First, in the step S3, the processor 2 sets the first timer to 0 second and operates the first timer 13. Next, the processor 2 performs the step S4. The step S4 includes a plurality of steps S4_1 to S4_9. The first timer 13 measures the time independently of the operation of the processor 2.

In the step S4_1, the processor 2 turns on the power switch 19 according to the ROM power control signal 51. In the step S4_2, the processor 2 controls the substrate bias circuit 6 according to the substrate bias control signal 50. Here, the substrate bias circuit 6 is controlled by the substrate bias control signal 50 so that the substrate bias circuit 6 generates the substrate bias voltage 40 for lowering the threshold voltage of the SRAM 3. Further, in the step S4_3, the processor 2 controls the selector 7 by the system clock selection signal 52 so that the selector 7 selects the first oscillation signal 8C generated by the oscillation circuit 8 as the system clock signal 53_C.

Next, in the step S4_4, the processor 2 reads the first program stored in the flash memory 4 and writes the read first program in the SRAM 3. That is, the first program stored in the flash memory 4 is transferred to the SRAM 3. At this time, since the system clock signal 53_C supplied to the processor 2 is the first oscillation signal 8C of 2 MHz, the first program is transferred from the flash memory 4 to the SRAM 3 at high speed. At this time, since the threshold voltage of the SRAM 3 is low, the SRAM3 can operate following high-speed accesses.

When the transfer of the first program is completed, in the step S4_5, the processor 2 turns off the power switch 19 in response to the ROM power control signal 51. Thereafter, in the step S4_6, the processor 2 controls the selector 7 by the system clock selection signal 52 so that the selector 7 selects the second oscillation signal 9C generated by the oscillation circuit 9 as the system clock signal 53_C. In addition, in the step S4_7, the processor 2 controls the substrate bias circuit 6 by the substrate bias control signal 50 so that the substrate bias circuit 6 generates the substrate bias voltages 40 for heightening the threshold voltage of the SRAM 3. As a result, the processor 2 operates in synchronization with the system clock signal 53_C of 32.768 kHz, and the threshold voltage of the SRAM 3 becomes high.

Further, in the step S4_8, the processor 2 executes the first program transferred to the SRAM 3 while reading the first program.

In the step S4_8, the first program is executed, whereby the motor driver 16 is controlled by the processor 2 so as to output the drive signal 55 for advancing the second hand by one second. The output of the drive signal 55 causes the hand moving motor 60 to rotate the second hand by an amount corresponding to 1 second.

When the first program has been executed, the processor 2 executes the step S4_9. In the step S4_9, the processor 2 controls the selector 7 by the system clock selection signal 52 so that the selector 7 selects the third oscillation signal 10C generated by the oscillation circuit 10 as the system clock signal 53_C. As a result, the operation of the processor 2 is slowed down, and it is in a standby mode. In the step S4_9, the system clock signal 53_C is changed to the third oscillation signal, but the present invention is not limited to the third oscillation signal. For example, also in the step S4_9, the system clock signal 53_C may maintain the second oscillation signal set in the step S4_6. In this instance, the third oscillation circuit 10 does not need to be formed in the semiconductor device 1, and the costs can be reduced.

After the step S4, the step S5 is performed. In the step S5, it is determined whether or not an external interrupt has occurred. That is, the external command is supplied to the input/output port 15 via the terminal T3, and it is detected whether or not the interrupt request signal 54_IO is supplied from the input/output port 15 to the interrupt controller 12. Since the semiconductor device 1 is a semiconductor device for the wristwatch, the hand movement is semi-permanently repeated. However, for example, when the battery cell 18 is exhausted, the exhaustion of the battery cell 18 is transmitted to the terminal T3 by the external command. When the external interrupt based on such the external command is detected in the step S5, the processor 2 next performs a step S6. In the step S6, the semiconductor device 1 terminates the operation.

On the other hand, when the external command is not detected in the step S6, the process returns to the step S2.

Thereafter, the steps S2 to S5 are repeated in the same manner, and the hand movement is continued.

In the step S4 described above, the steps S4_1 and S4_2 can be regarded as a step (hereinafter called a "first step") for performing a process prior to high-speed transfer of the first program from the flash memory 4 to the flash memory SRAM 3. In this case, the steps S4_3 and S4_4 can be regarded as a step (hereinafter called a "second step") for executing a process for high-speed transfer of the first program. The steps S4_5 to S4_8 can be regarded as a step (hereinafter called a "third step") for executing the first program. In this case, the step S4_9 can be regarded as a step (hereinafter called a "fourth step") for performing a process for shifting to the standby.

Figure 4:
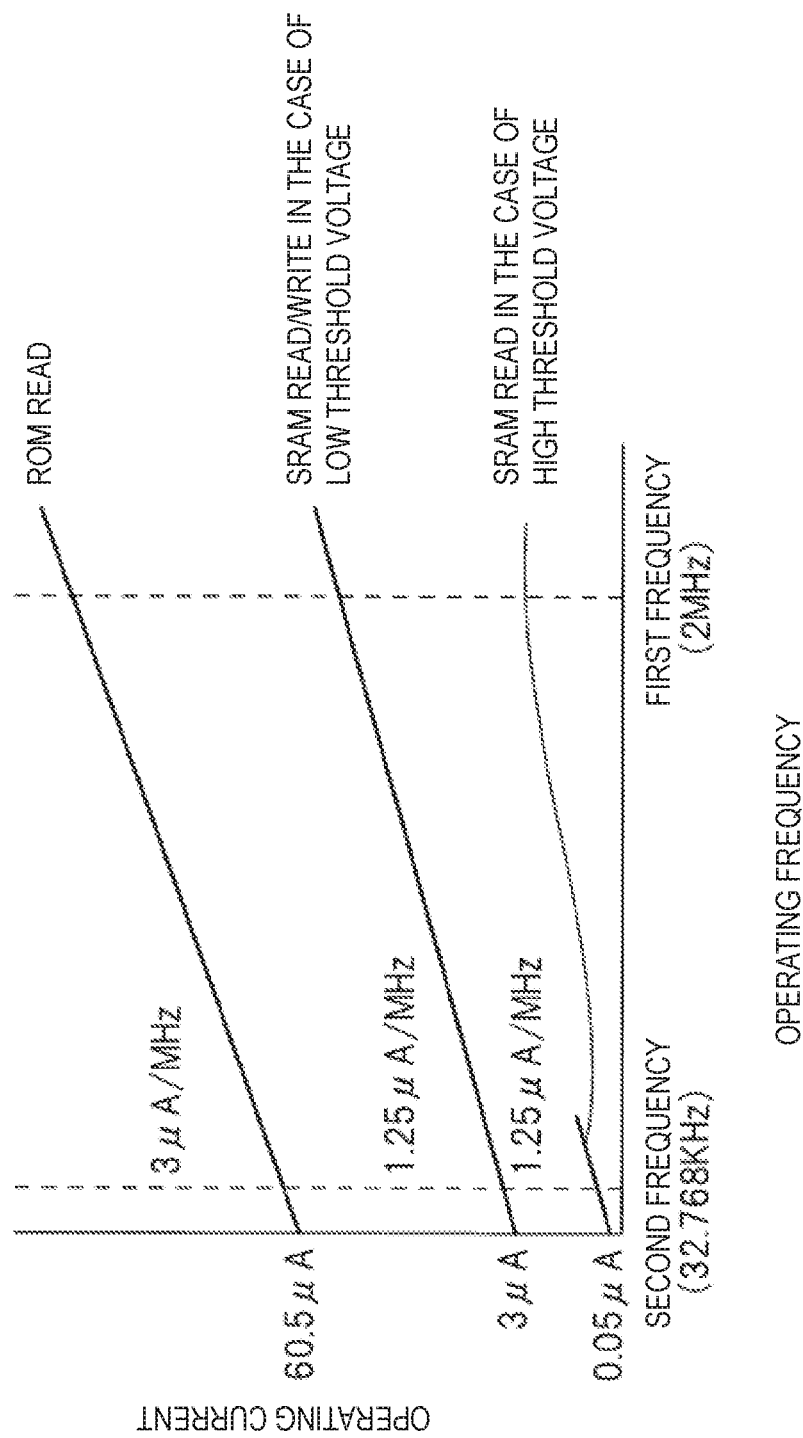
FIG. 4 is a diagram showing a relation between an operating current and an operating frequency of a ROM and a SRAM according to the first embodiment.

FIG. 4 is a diagram showing a relation between an operating current and an operating frequency of the flash memory 4 and the SRAM 3 according to the first embodiment. In FIG. 4, a horizontal axis represents the operating frequency, and a vertical axis represents the operating current. In FIG. 4, the flash memory 4 is depicted as a ROM.

Increasing the operating frequencies of both the ROM and the SRAM increases the operating current. In particular, the ROM generally has a large DC leakage current. Therefore, even if the operating frequency is low, a current consumption of the ROM is large. When the ROM is operated at a low operating frequency, there is a disadvantage from the viewpoint of the electric power consumption. On the other hand, when the operating frequency of the SRAM is low, a current consumption of the SRAM is low. In particular, when the threshold voltage of the SRAM is heightened by the substrate bias voltage, the DC leakage current can be further reduced. Therefore, the electric power consumption of the SRAM is extremely low when operating at low frequency.

In the first embodiment, the hand movement operation is performed by executing the first programs, and the frequency of the system clock signal at this time is 32.768 kHz. At this time, since the SRAM 3 is at a high threshold voltage due to the substrate bias voltage 40, a consumption current of the SRAM 3, as indicated by the "SRAM read in the case of high threshold voltage" in FIG. 4, is much smaller than the current consumption of the ROM, as indicated by the "ROM read" in FIG. 4. In other words, the electric power consumption can be greatly reduced by reading out the first program from the SRAM 3 and executing the first program at the frequency of 32.768 kHz of the second oscillation signal, as compared with reading out the first program from the flash memory 4 and executing the first program at the frequency of 32.768 kHz of the second oscillation signal.

On the other hand, when the SRAM 3 is set to the high threshold voltage, the upper limit of the operating frequency of the SRAM 3 is, for example, about 256 kHz. In the first embodiment, the first program is transferred from the flash memory 4 to the SARM 3, but when, for example, the SRAM 3 is set to the high threshold voltage and operating at the upper operating frequency (256 kHz), the flash memory 4 also operates at this upper operating frequency. Therefore, a time period of operating the flash memory 4 with the large DC leak current becomes longer, and the electric power consumption is increased.

Therefore, in the first embodiment, when the first program is transferred from the flash memory 4 to the SRAM 3, the system clock signal is changed to the frequency 2 MHz of the first oscillation signal, the SRAM 3 and the flash memory 4 are operated at the frequency of the first oscillation signal, and the first program is transferred from the flash memory 4 to the SRAM 3 in a short time. In this case, the substrate bias voltage 40 is supplied to the SRAM 3 to lower the threshold voltage of the SRAM 3 in order to increase the upper limit of the operating frequency of the SRAM 3. When the threshold voltage of the SRAM 3 is set low, the current consumption is high as indicated by "SRAM read/write in the case of low threshold voltage" in FIG. 4, but the current consumption is still much smaller than the current consumption of the flash memory 4 (ROM).

In FIG. 4, "3 µA/MHz" and "1.25 µA/MHz" indicate the rate of change of the operating currents with respect to the operating frequencies of the ROM and the SRAM.

According to the first embodiment, prior to executing the first program, the first program is transferred from the flash memory 4 to the SRAM 3, and the transferred first program in the SRAM is executed. Therefore, even if a bit is converted in the SRAM 3 due to a soft error and the like, a decrease in reliability can be suppressed by executing the transferred first program. In addition, as described above, since the current consumption can be reduced, it is possible to suppress the decrease in reliability while reducing the electric power consumption.

Second Embodiment

In the first embodiment, every time the first program is executed, the operation of transferring the first program from the flash memory 4 to the SRAM 3 is performed. That is, the program transfer operation is performed every time in response to the interrupt request signal generated every second. This is not desirable from the viewpoint of the electric power consumption. The frequency of the program transfer operation can be quantitatively reduced based on an error rate of the SRAM 3.

The error rate of the SRAM can be expressed in FIT (Failures-In-Time). 1 FIT represents the occurrence of one error in one billion hours (10 raised to the power of 9) when the SRAM is operated. For a typical SRAM, the error rate due to soft errors is on the order of 100 FIT with 1 Mbit (128 Kbytes) storage.

One billion hours corresponds to about 100,000 years. For a SRAM with 1 FIT that generates an error once every 100,000 years, the chance of an error occurring in ten years is one ten-thousandth. In other words, if a product fails due to an error caused by the SRAM of the 1 FIT, the market failure rate caused by the SRAM error is 100 ppm (parts per million). This 100 ppm is the target of a 10-year market defect rate for consumer products. Therefore, errors caused by SRAM must be suppressed to 100 ppm. Therefore, when the error rate is, for example, the SRAM of N FIT, if the first program is transferred from the flash memory 4 to the SRAM 3 once every 10 (years)/N=k (years), the market defect rate of 100 ppm can be equivalently achieved. Here, N is an arbitrary number.

However, this value k is a minimum value. Actually, in terms of the defective rate of products, the fraction of defective rate caused by the SRAM should be determined, and the program should be transferred at a frequency corresponding to the determined fraction of the defective rate. For example, when the fraction of the defect rate caused by SRAM is set to 1 ppm, the first program should be transferred from the flash memory 4 to the SRAM 3 once every 10 (years)/N/100=0.1/N=k (years). When a typical SRAM FIT is 100 FIT, the value k would be 8.76 hours.

That is, if the first program is transferred from the flash memory 4 to the SRAM 3 at a frequency of one or more times every eight hours, the effect of the garbled bits caused by soft errors can be effectively avoided in many products.

Of course, if the transfer of the first program is performed at a higher frequency, the reliability can be further increased. If the size of the first program is small, the number of FIT becomes smaller. For example, when a system clock signal having a frequency of about 32 kHz is used, the size of the first program that can be executed in 1 second or less is, for example, 16 kB or less. This size may be taken into account to further reduce the frequency of transfers. The operation of transferring the first program again after transferring the first program from the flash memory 4 to the SRAM 3 can be regarded as the operation of refreshing the first program in the SRAM 3. In this case, the frequency of retransmission of the first program can be regarded as the frequency of refresh.

In a second embodiment, the semiconductor device is provided in which the first program is not transferred from the flash memory 4 to the SRAM 3 every second, and the first program is transferred at any frequency. As a result, the frequency of transferring the first programs from the flash memory 4 to the SRAM 3 can be appropriately reduced to a level that is not problematic.

In the second embodiment, the register 11_2 and the second timer 14 shown in FIG. 1 are used. Forms other than the register 11_2 and the second timer 14 are the same as those of the first embodiment. In the register 11_2, the time information for determining the frequency of transferring the first program is set. The second timer 14 measures time and generates the interrupt request signal 54_T2 when the measured time exceeds a time represented by the time information set in the register 11_2. The generation of the interrupt request signal 54_T2 is notified to the processor 2 by the interrupt controller 12, and the processor 2 executes a program corresponding to the interrupt request signal 54_T2.

Here, the first program is transferred from the flash memory 4 to the SRAM3 at a frequency of once every 60 seconds. The transfer time interval of 60 seconds is set in advance in the register 11_2 as the time information. Of course, 60 seconds is an example, and a user sets a desired value in the register 11_2. For example, when the error rate of the SRAM 3 is N, the register 11_2 is set with the time information representing a time equal to or less than the above-mentioned value k (=10 years/N). When a typical SRAM is used as the SRAM 3, it is desirable to set the time information indicating a time of more than 1 second and 8 hours or less in the register 11_2.

(Operation of Semiconductor Device)

Figure 5:
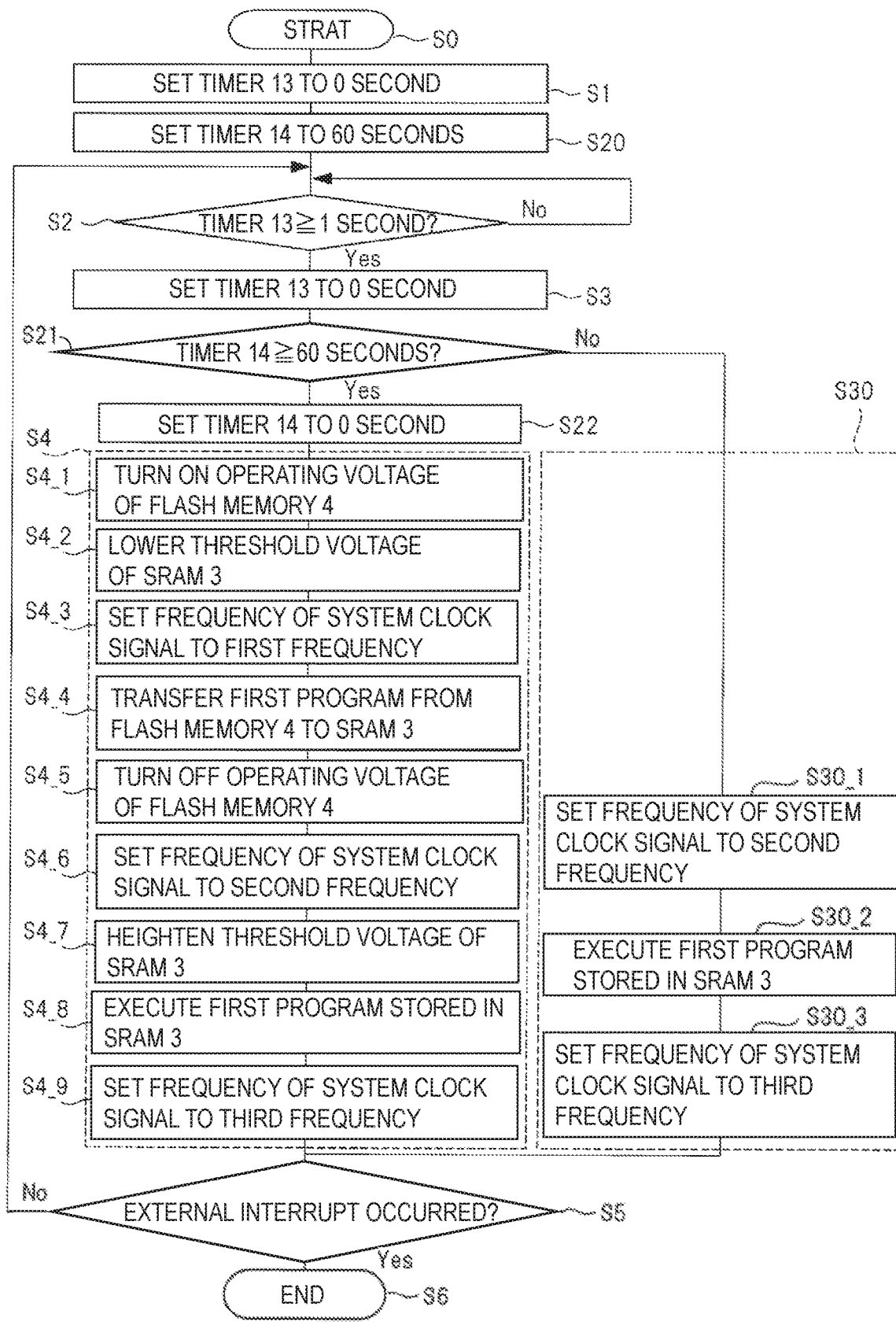
FIG. 5 is a flow chart showing an operation of a semiconductor device according to a second embodiment.

FIG. 5 is a flow chart showing an operation of a semiconductor device according to the second embodiment. Since FIG. 5 is similar to FIG. 3, the differences will be mainly explained. The difference is that steps S20 to S22, S30, and S30_1 to S30_3 are added to FIG. 3.

Also, in the second embodiment, the time is measured by the first timer 13, and when 1 second is measured by the first timer 13, the processor 2 executes the step S4 or the step S30 in order to perform the hand movement operation. Whichever the step is selected is described in detail later, but is performed in the step S21 (hereinafter called a "sixth step"). In both the step S4 and the step S30, the processor 2 reads and executes the first program transferred to the SRAM 3. When the first program is executed, the hand movement operation is performed.

Prior to the steps S4 and S30, the processor 2 determines whether or not to transfer the first program from the flash memory 4 to the SRAM 3. That is, it is determined whether or not the transfer of the first program is to be performed again. The measurement of the time by the second timer 14 is used as a determination criterion at this time.

Hereinafter, a concrete description will be given. In the step S20, the processor 2 sets the second timer 14 to 60 seconds to operate the second timer 14. The timer 14 starts measuring the time from the set 60 seconds and generates the interrupt request signal 54_T2 when the measured time exceeds the time information set in the register 11_2.

The occurrence of the interrupt request signal 54_T2 is determined in the step S21. In the step S20, since the second timer 14 is set to 60 seconds, the processor 2 determines that the second timer 14 is more than 60 seconds and performs the step S22 (hereinafter called a "seventh step"). In the step S22, the processor 2 sets the second timer 14 to 0 second to operate the second timer 14.

Next, the processor 2 performs the steps S4 and S5 in this order. Since the operations in the steps S4 and S5 are the same as those in the first embodiment, their descriptions are omitted. If the external command is not generated, the processor 2 performs the steps S2, S3, and S21 in this order after the step S5. The steps S2 and S3 are the same as those in the first embodiment, and therefore descriptions thereof are omitted.

The second timer 14 is set to 0 second when the step S22 is performed first, and starts the operation of time measurement, but has not yet exceeded 60 seconds, and therefore has not generated the interrupt request signal 54_T. Therefore, in the step S21, it is determined that the measurement time of the second timer 14 is less than 60 seconds. Next, the processor 2 performs the step S30 (hereinafter called a "fifth step"). In the step S30, the processor 2 performs the steps in the order of steps S30_1 to S30_3. Here, an operation performed in the step S30_1 is the same as the step S4_6, an operation performed in the step S30_2 is the same as the step S4_8, and an operation performed in the step S30_3 is the same as the step S4_9. Therefore, by performing the step S30, the system clock signal 53_C is changed to the frequency of the second oscillation signal 9C, and the processor 2 executes the first program while reading the first program stored in the SRAM 3 in synchronization with the frequency of the second oscillation signal 9C. As a result, when the hand movement operation is performed and the first programming is completed, the frequency of the system clock signal 53_C is changed to the frequency of the third oscillation signal 10C.

When the step S30 is completed, the step S5 is performed, and if the external command has not been generated, the step S2 is performed next. Thereafter, the step S30 is performed every time the interrupt request signal 54_T1 is generated by the first timer 13 until the interrupt request signal 54_T2 is generated from the second timer 14. When the second timer 14 generates the interrupt request signal 54_T2 after 60 seconds have elapsed, the step S4 is performed instead of the step S30, and the SRAM 3 is refreshed and the hand movement operation is performed in the step S4.

In the second embodiment, when the step S30 is performed, the step S4 is performed first. Therefore, when the step S30 is performed, the step S4_7 is performed first. Therefore, when the step S30 is performed, the threshold voltage of the SRAM 3 is set higher. In the step S20 of the second embodiment, the time information (60 seconds) set in the register 11_2 is set in the second timer 14 in order to ensure that the step S4 is performed first when the process starts at the step S0, that is, when the process starts first.

In the second embodiment, the first program is transferred from the flash memory 4 to the SRAM 3 once every 60 seconds to refresh the SRAM 3, but the time is not limited to this. That is, the time information to be set in the register 11_2 may be determined based on the error rate of the SRAM 3.

According to the second embodiment, it is possible to suppress an increase in power consumed by the program transfer operation while maintaining an error tolerance of the SRAM 3 to such a degree that the error tolerance does not cause problems in actual use.

In the second embodiment, the step S4 is repeatedly performed at interval of time (for example, 60 seconds) represented by the time information set in the register 11_2, and the step S30 is repeatedly performed at interval of time (for example, 1 second) represented by the time information set in the register 11_1 when the SRAM 3 is not refreshed.

Further, in the second embodiment, if the processor 2 sets 60 seconds to the timer 14 at all times, for example, in the step S22, the step S4 is selected at all times in the step S21. As a result, the same operation as that of the first embodiment can be realized in the second embodiment.

(Comparison with Comparison Examples)

Here, the results of comparison between the examples described in the section of "SUMMARY" and the first and second embodiments will be described. In the section of "SUMMARY", two examples have been described. In other words, the example of reading and executing programs in which the processor is stored in the ROM and the example described in Patent Document 1 have been described. In the following description, the former is referred to as a first comparison example, and the latter is referred to as a second comparison example. The ROM used in the first and second comparison examples is assumed to be comprised of a flash memory.

Figure 6:
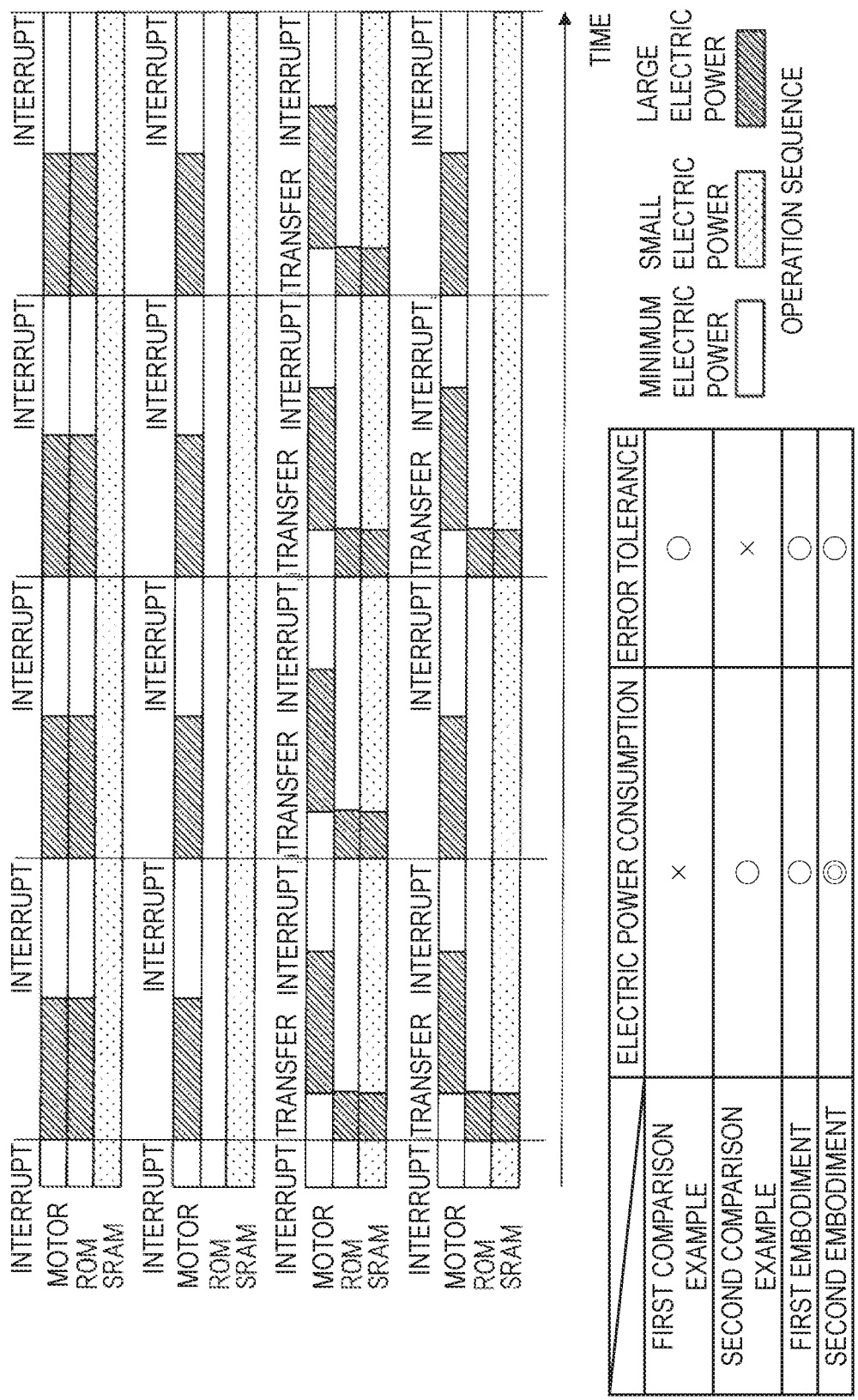
FIG. 6 is a diagram showing the comparison result of the semiconductor devices according to the first and second embodiments with comparison examples.

FIG. 6 is a diagram showing a comparison result of the semiconductor device according to the first and second embodiments with the comparison examples. FIG. 6 shows operation sequences and comparison results according to the first and second comparison examples and the semiconductor devices of the first and second embodiments.

In FIG. 6, the operation sequences are shown on the right side of the drawing, and the comparison results are shown on the left side of the drawing. The items of the comparison results are the electric power consumption and the error tolerance. The error tolerance indicates a tolerance to errors caused by soft errors, noises, and the like, and the electric power consumption indicates an electric power consumption of the semiconductor device. In the comparison results, excellent ones are marked with the symbol ○, especially excellent ones are marked with the symbol ⊚, and inferior ones are marked with the symbol x.

As the operation sequences, the operation periods of the hand moving motor, the ROM (flash memory), and the SRAM and the electric power consumptions (electric powers) during the operation periods are shown. Here, the period indicated by the slashed pattern is a period in which electric power is large, the period indicated by the dotted pattern is a period in which electric power is small, and the period indicated by the voided pattern is a period in which electric power is minimum.

Every second, an interrupt request is generated (referred to as an interrupt in FIG. 6), a corresponding program (the first program in the first and second embodiments) is executed in response to the interrupt request, and the motor is operated to perform the hand movement operation.

In the first comparison example, in response to an interrupt, a program is read from the ROM and executed. Each time the interrupt occurs, the power in the ROM and the hand moving motor is increasing for a predetermined period of time. The program is read from a ROM having the large DC leakage current. Therefore, as shown in the comparison results, although the first comparison example is inferior in terms of the electric power consumption, the first comparison example is excellent in terms of the error tolerance.

On the other hand, in the second comparison example, the program transferred to the SRAM is executed in response to the interrupt, and the motor operates every second. Since the program is transferred from the ROM to the SRAM in advance, the electric power consumption of the ROM can be minimized by not supplying the operating voltage to the ROM. The second comparison example is excellent in terms of the electric power consumption as shown in the comparison results. However, since the program transferred to the SRAM is executed, the second comparison example is inferior in terms of the error tolerance.

In the first embodiment, the operating voltage is supplied to the ROM in response to the interrupt, the first program stored in the ROM is transferred to the SRAM, the first program transferred to the SRAM is executed, and the motor operates in response to the interrupt. During the transmission of the first program, the frequency of the system clock signal is increased. Therefore, during the program transfer for transferring the first program, the electric power consumptions of the ROM and the SRAM are increased. However, since the program transfer period is short, the first embodiment is excellent in terms of the electric power consumption as shown in the comparison results. Every time the interrupt occurs, the first program stored in the ROM is transferred to the SRAM, and the first program transferred to the SRAM is executed. Therefore, it is possible to reduce malfunctions due to soft errors, noise, and the like. Therefore, as shown in the comparison results, the first embodiment is also excellent in terms of the error tolerance. That is, both the electric power consumption and the error tolerance of the semiconductor device according to the first embodiment are excellent.

In the second embodiment, the first program is not transferred from the ROM to the SRAM every time the interrupt occurs, but the first program is transferred at a predetermined frequency. In FIG. 6, for two interrupts occurring, only one programmable transfer is performed, so that the electric power consumption can be reduced. As a result, the semiconductor device according to the second embodiment has a particularly excellent electric power consumption while maintaining an excellent error tolerance.

(Comparison of Average Current)

Figure 7B:
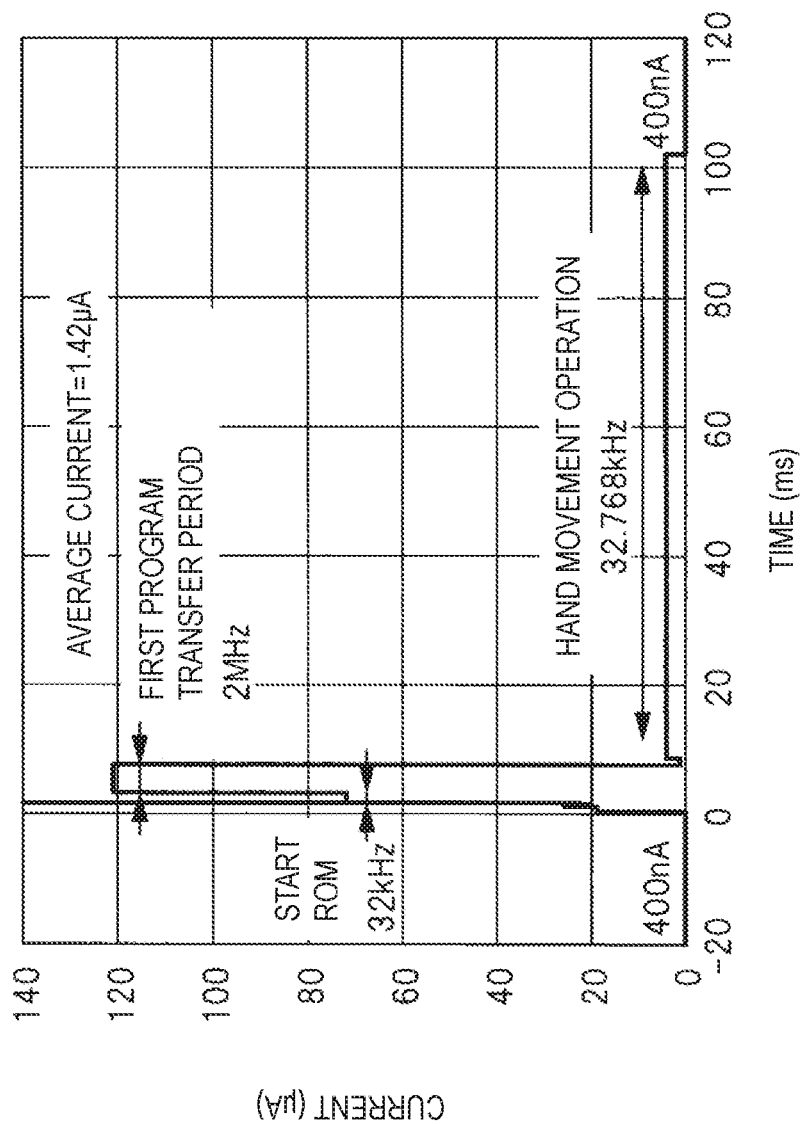

Next, the comparison results of the average currents of the semiconductor device 1 according to first embodiment and the first comparison example will be described. FIGS. 7A and 7B are diagrams showing the average currents of the semiconductor device according to the first embodiment and the first comparison example. FIGS. 7A and 7B show waveforms obtained by simulating current changes in the semiconductor device 1 and the first comparison example. In FIGS. 7A and 7B, the horizontal axis represents the time, and the vertical axis represents the current. Here, FIG. 7A shows the current change of the first comparison example, and FIG. 7B shows the current change of the semiconductor device 1.

In the semiconductor device 1 and the first comparison example, the currents are very small (400 nA) during the periods in which the ROM (flash memory) is not started and the hand movement operation is not performed. It is assumed that the system clock signal is 32 kHz when the ROM is started. When the ROM is started, the current instantaneously increases.

In the first comparison example, after starting the ROM, the system clock signal is changed to 32.786 kHz, the ROM is accessed, the programs stored in the ROM are executed, and the hand movement operation is performed. Since the ROM is accessed during the hand movement operation, the operating voltage is supplied to the ROM, and a large current flows continuously during the hand movement operation. Therefore, the average current is 5.75 μA.

On the other hand, in the semiconductor device 1, after starting the ROM (flash memory), the system clock signal is changed to 2 MHz as described with reference to FIG. 3, and the first program is transferred from the flash memory 4 to the SRAM 3. In the program transfer period during which the first program is being transferred, the operating speed of the processor for accessing both the flash memory 4 and the SRAM3 is as high as 2 MHz, so that the current in the program transfer period becomes large. However, when the transfer of the program is completed, the system clock signal is changed to 32.768 kHz, and in synchronization with this system clock signal, the processor accesses the SRAM3 and executes the first program transferred to the SRAM 3. When the program transfer is completed, the operating voltage is not supplied to the flash memory 4. Therefore, the current consumption is reduced during the period in which the hand movement operation is performed. As a result, in the semiconductor device 1, the average current can be as low as 1.42 μA.

(Comparing Current Consumption by Operating Frequency)

Figure 8:
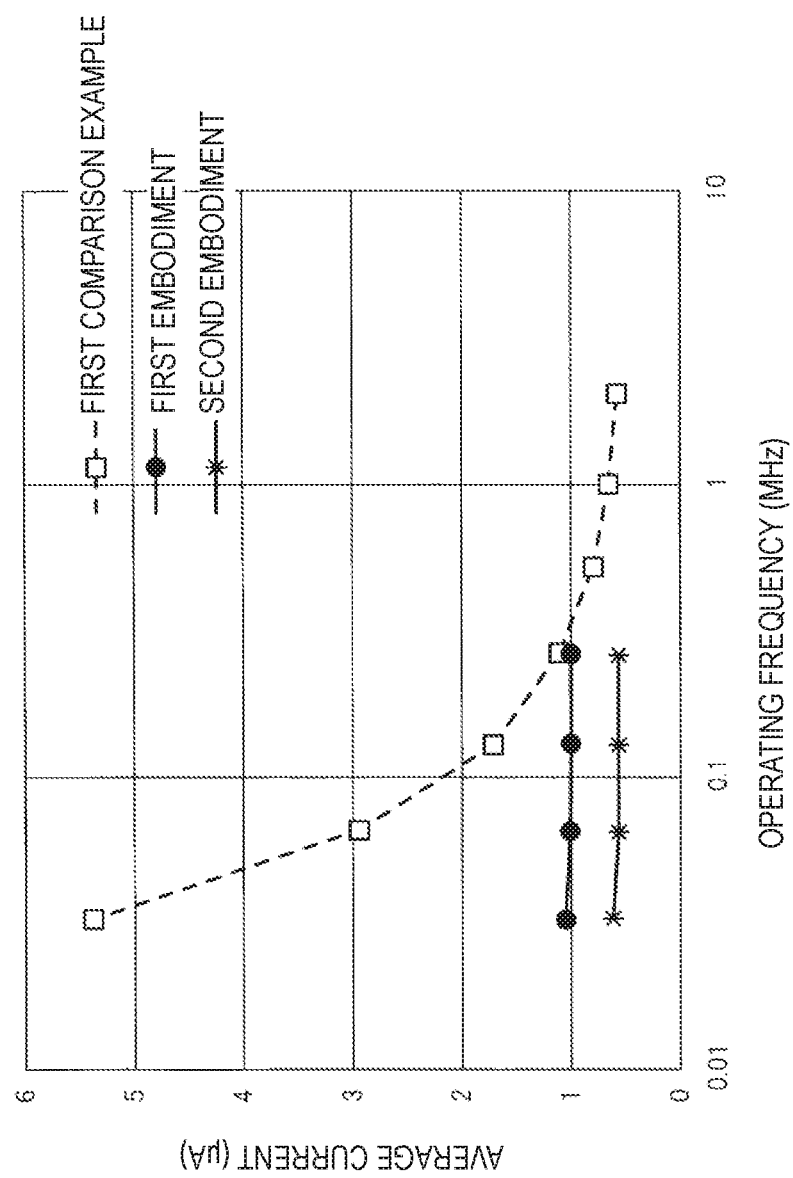
FIG. 8 is a diagram showing changes of the average currents of the semiconductor devices according to the first and second embodiments and the first comparison example.

FIG. 8 is a diagram showing the changes in the average currents of the semiconductor device according to the first and second embodiments and the first comparison example. In FIG. 8, the horizontal axis represents the operating frequency (the frequency of the second oscillation signal) when the hand movement program (the first program) is executed, and the vertical axis represents the average current. FIG. 8 shows the change of the average currents of the semiconductor device according to the first and second embodiments and the first comparison example when the operating frequency is changed.

Here, the execution amount of the hand movement program is 3000 cycles. That is, the cycle number of the system clock signal required to execute the hand movement program is 3000. If the hand movement program is executed at higher operating frequency, the process time can be shortened, and the effect of the DC leakage currents of the ROM and the SRAM can be reduced.

As illustrated in FIG. 8, in the first and second embodiments, when the first program transferred to the SRAM 3 is executed by processor 2 and at this time the operating voltage is not supplied to the ROM (flash memory 4), the average currents are almost constant, with little dependence on the operating frequency, because of the small DC leakage current of the SRAM.

On the other hand, in the first comparison example, since the program is read out from the ROM having the large DC leakage current and executed, the average current becomes larger as the operation frequency becomes lower and the processing time becomes longer. In the case of the first comparison example, when the operating frequency becomes higher and the processing time becomes shorter, the average current asymptotically approaches a constant value. However, when the operating frequency is 256 kHz or less, the average currents of the semiconductor devices according to the first and second embodiments are smaller than the average current of the first comparison example. Therefore, the operating frequencies of the SRAM 3 and the flash memory when executing the first programs are desirably 256 kHz or less, and the system clock signal of 32.768 kHz or less is used in the first and second embodiments.

As shown in FIG. 8, when the operating frequency exceeds 1 MHz, the average current of the first comparison example is smaller than that of the semiconductor device according to the first embodiment. This is because, in the semiconductor device 1 according to the first embodiment, every time the interrupt request signal is generated, the current consumption caused by the program transfer operation for transferring the first program from the flash memory to the SRAM is added. On the other hand, when an integrated current calculated by the average current and the processing time of the ROM exceeds 1 MHz, the integrated current asymptotically approaches a constant value. In other words, the influence of the DC leakage current can be sufficiently reduced by operating the ROM at 1 MHz or more. Therefore, in the first and second embodiments, when the program is transferred from the flash memory 4 to the SRAM 3, the system clock signal of 2 MHz is used so that the flash memory 4 operates at 1 MHz or more. As a result, the influence of the DC leakage current in the flash memory 4 is reduced.

In addition, in the second embodiment, the average current can be reduced by reducing the frequency of the program transfer operation. Thus, in FIG. 8, the average current of the semiconductor device according to the second embodiment is reduced by about half compared to the average current of the semiconductor device according to the first embodiment.

Third Embodiment

In the second embodiment, the first program is transferred from the flash memory 4 to the SRAM 3 at predetermined time intervals by using the second timer 14. That is, a configuration in which the SRAM 3 is refreshed periodically with a predetermined period as one cycle has been described in the second embodiment.

However, soft errors, noises, and the like that cause errors in the SRAM vary depending on circumstances. For example, when the wristwatch is military, or when the user of the wristwatch ride on an airplane or climb, the wristwatch is placed in harsh environments, and soft errors are more likely to cause errors in the SRAM.

In a third embodiment, a semiconductor device is provided that allows the refresh intervals to be changed. This makes it possible to prioritize the low electric power consumption and prioritize the reliability in accordance with the environment.

Figure 9:
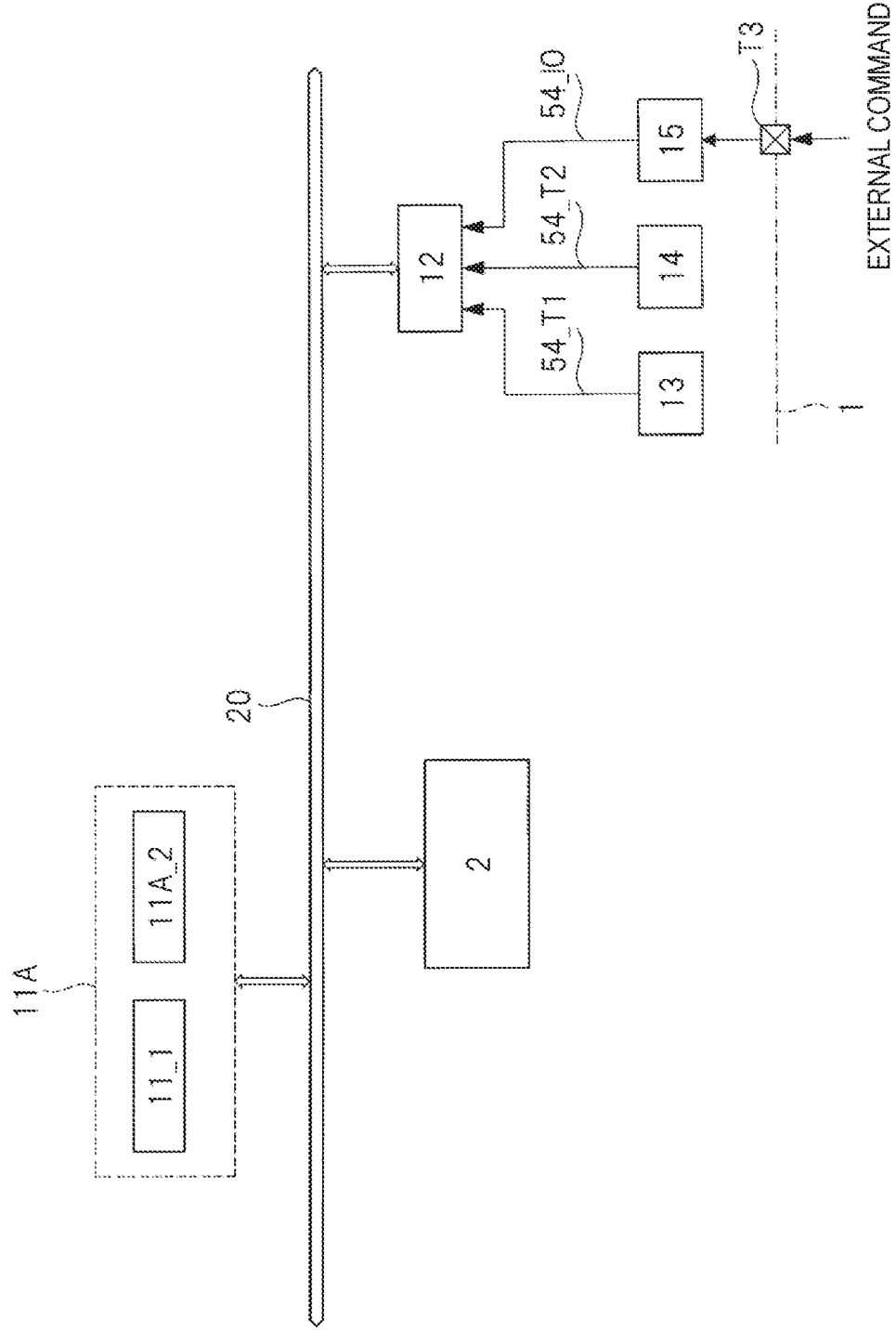
FIG. 9 is a block diagram showing a configuration of a main portion of a semiconductor device according to a third embodiment.

FIG. 9 is a block diagram showing a configuration of a main portion of the semiconductor device according to the third embodiment. In the third embodiment, the register group 11 is changed in the semiconductor device 1 shown in FIG. 1. That is, the register group 11 is changed to a register group 11A shown in FIG. 9. In the semiconductor device 1 according to the third embodiment, the configuration of the other circuit blocks except for the register group 11A is the same as that of FIG. 1. Therefore, FIG. 9 depicts only the blocks needed to illustrate the third embodiment.

The register group 11A includes the register 11_1 corresponding to the first timer 13 and a register 11A_2 corresponding to the second timer 14. The time information is set in the register 11_1 in the same manner as the first and second embodiments, and when the time measured by the first timer 13 exceeds the time represented by the time information set in the register 11_1, the first timer 13 generates the interrupt request signal 54_T1. In the register 11_1, the time information indicating 1 second is set in the same manner as the first and second embodiments.

In the register 11A_2, the time information is set in the same manner as the second embodiment. When the time measured by the second timer 14 exceeds the time represented by the time information set in the register 11A_2, the second timer 14 generates the interrupt request signal 54_T2. In the third embodiment, the time information set in the register 11A_2 is variable. That is, the time information of the register 11A_2 can be changed by the user while the semiconductor device 1 is operating.

When the user operates a button formed on the wristwatch, the external command is supplied to the input/output port 15 via the terminal T3 of the semiconductor device 1, and the input/output port 15 generates the interrupt request signal 54_IO. The interrupt controller 12 responds to the interrupt request signal 54_IO to notify the processor 2 that the interrupt by the external command has occurred. The processor 2 performs a time change process corresponding to the interrupt by the external command. In this time change process, the processor 2 sets new time information in the register 11A_2. For example, it is assumed that time information representing 8 hours is set in advance in the register 11A_2. By operating the button, in the time change process corresponding to the interruption by the external command, the processor 2 sets the time data representing, for example, 10 seconds in the register 11A_2.

Thus, when the time information representing 8 hours is set in the register 11A_2, the operation of transferring the first program from the flash memory 4 to the SRAM 3 is performed at 8 hour intervals as described in the second embodiment, whereas when the time information representing 10 seconds is set, the operation of transferring the first program from the flash memory 4 to the SRAM 3 is performed at 10 second intervals. In a normal living environment, by setting the time information of 8 hour in the register 11A_2 as described above, the electric power consumption can be further reduced and the low electric power consumption can be prioritized. On the other hand, in a severe environment, by setting the time information of 10 seconds in the register 11A_2, the error tolerance can be improved and the reliability can be prioritized.

Here, the description has been made by taking 8 hours and 10 seconds as an example, but the time are not limited to the above. Alternatively, the time information to be set in the register 11A_2 may be selected from three or more types of time instead of two types of time such as 8 hours and 10 seconds by operating the button. For example, a plurality of pieces of time information are stored in advance in the flash memory 4 and the like, and the processor 2 selects a particular piece of time information from the plurality of pieces of time information and sets the selected pieces of time information in the register 11A_2 in the time change process, whereby the SRAM 3 refresh intervals can be dynamically set in accordance with circumstances.

In the second embodiment, the SRAM 3 is refreshed periodically, but the refreshing may be performed aperiodically. That is, a first period from the transfer of the first program from the flash memory 4 to the SRAM 3 to the transfer of the same first program from the flash memory 4 to the SRAM 3, and s second period until the first program is further transferred from the flash memory 4 to the SRAM 3 after the first period may have different temporal lengths.

In the first, second and third embodiments, the flash memory which is a rewritable nonvolatile memory is used as the ROM, but the ROM may be a non-rewritable nonvolatile memory. There is a mask ROM as the non-rewritable nonvolatile memory, but since the DC leakage current is large in the mask ROM as well, even when the mask ROM is used instead of the flash memory of the first, second and third embodiments, it is possible to provide a semiconductor device capable of reducing electric power consumption while suppressing deterioration in reliability.

In the first and second embodiments, when the power is re-supplied after the power supply from the battery cell 18 is stopped to the semiconductor device 1, the process starts from the step S0 illustrated in FIGS. 3 and 5. Therefore, the first program is transferred from the flash memory 4 to the SRAM 3, and the first program transferred to the SRAM 3 is executed by the processor 2.

Although the invention made by the present inventor has been specifically described based on the embodiments, the present invention is not limited to the embodiments described above, and it is needless to say that various modifications can be made without departing from the gist thereof. That is, in the embodiments, although an example has been described as an object of the wristwatch, the present invention can be applied to an object in which the same process is repeatedly performed. In FIG. 1, three oscillation circuit are used, but the number of oscillation circuit is not limited to this. Further, although the frequency of the oscillation signal used in the wristwatch has been described as an example, the frequency of the oscillation signal formed by the oscillation circuit may also be changed according to the object to be applied.

What is claimed is:

1. A semiconductor device comprising:
a ROM storing a first program;
a SRAM coupling to the ROM;
a first oscillation circuit for generating a signal of a first frequency;
a second oscillation circuit for generating a signal of a second frequency; and
a processor operating in synchronization with a system clock signal,
wherein a value of the second frequency is lower than a value of the first frequency, and
wherein the processor performs:
a first step of turning on a power supply of the ROM and lowering a threshold voltage of the SRAM;
a second step of setting the signal of the first frequency as the system clock signal and transferring the first program from the ROM to the SRAM based on the first frequency; and
a third step of turning off the power supply of the ROM, setting the signal of the second frequency as the system clock signal, heightening the threshold voltage of the SRAM, and executing the first program transferred to the SRAM based on the second frequency.

2. The semiconductor device according to claim 1, further comprising a third oscillation circuit for generating a signal of a third frequency,
wherein the processor performs a fourth step of setting the signal of the third frequency as the system clock signal after the third step.

3. The semiconductor device according to claim 1,
wherein the processor repeatedly performs the first to third steps.

4. The semiconductor device according to claim 2,
wherein the processor performs a fifth step of setting the signal of the second frequency as the system clock signal, executing the first program transferred to the SRAM based on the second frequency, and setting the signal of the third frequency as the system clock signal.

5. The semiconductor device according to claim 4, wherein the processor performs the fifth step at least once after the first to third steps.

6. The semiconductor device according to claim 5, wherein the processor performs the first to third steps again after the fifth step.

7. The semiconductor device according to claim 4, wherein the first to third steps are repeatedly performed, wherein the fifth step is repeatedly performed, and wherein an interval of the repetition of the first to third steps or an interval of the repetition of the fifth step is the same.

8. The semiconductor device according to claim 7, wherein the interval of the repetition of the fifth step is 1 second, and wherein the interval of the repetition of the first to third steps is longer than 1 second.

9. The semiconductor device according to claim 8, wherein the first program is a program for executing an operation of advancing a hand display of a wristwatch for one second.

10. The semiconductor device according to claim 4, wherein the processor performs a sixth step of selecting the first to third steps or the fifth step.

11. The semiconductor device according to claim 10, wherein the processor selects the first to third steps at all times in the sixth step.

12. The semiconductor device according to claim 10, further comprising a timer for measuring time, wherein the processor performs a seventh step of setting the timer to 0 second after the first to third steps, wherein the processor selects the first to third steps in the sixth step if a time measured by the timer exceeds a predetermined set time, and selects the fifth step in the sixth step if the time does not exceed the predetermined set time.

13. The semiconductor device according to claim 1, wherein a value of the first frequency is 1 MHz or more.

14. The semiconductor device according to claim 2, wherein a value of the third frequency is the same as a value of the second frequency.

15. The semiconductor device according to claim 1, wherein a value of the second frequency is 256 kHz or less.

16. The semiconductor device according to claim 1, wherein the SRAM is formed on a SOI substrate.

17. A semiconductor device comprising:
a SRAM formed on a SOI substrate;
a ROM storing a first program and coupling to the SRAM; and
a processor coupling to the ROM and the RAM,
wherein the processor transfers the first program from the ROM to the SRAM and executes the first program transferred to the SRAM, in synchronization with a system clock signal,
  wherein the first program is transferred from the ROM to the SRAM repeatedly, and
  wherein a frequency of the system clock signal when the processor executes the first program transferred to the SRAM is lower than a frequency of the system clock signal when the processor transfers the first program from the ROM to the SRAM.

18. The semiconductor device according to claim 17, wherein the repetitive transfers of the first program from the ROM to the SRAM are periodic.

19. The semiconductor device according to claim 18, further comprising a substrate bias circuit coupling to the SRAM,
  wherein a threshold voltage of the SRAM is controlled by the substrate bias circuit such that the threshold voltage of the SRAM when the processor transfers the first program from the ROM to the SRAM is lower than the threshold voltage of the SRAM when the processor executes the first program transferred to the SRAM.

\* \* \* \* \*